(12) United States Patent
Liu et al.

(10) Patent No.: US 7,166,522 B2
(45) Date of Patent: Jan. 23, 2007

(54) METHOD OF FORMING A RELAXED SEMICONDUCTOR BUFFER LAYER ON A SUBSTRATE WITH A LARGE LATTICE MISMATCH

(75) Inventors: Jin Ping Liu, Singapore (SG); Dong Kyun Sohn, Singapore (SG); Liang Choo Hsia, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 190 days.

(21) Appl. No.: 10/865,433

(22) Filed: Jun. 10, 2004

(65) Prior Publication Data

US 2005/0164436 A1 Jul. 28, 2005

Related U.S. Application Data

(63) Continuation-in-part of application No. 10/763,305, filed on Jan. 23, 2004.

(51) Int. Cl.
*H01L 21/20* (2006.01)
(52) U.S. Cl. ..................................... 438/478
(58) Field of Classification Search ............... 257/347, 257/191; 438/478
See application file for complete search history.

(56) References Cited

U.S. PATENT DOCUMENTS

| | | | | |
|---|---|---|---|---|
| 5,821,577 | A | 10/1998 | Crabbé ..................... | 257/288 |
| 5,859,864 | A | 1/1999 | Jewell ..................... | 372/45 |
| 6,515,335 | B1 * | 2/2003 | Christiansen et al. ....... | 257/347 |
| 6,573,126 | B1 | 6/2003 | Cheng et al. ............... | 438/149 |
| 6,583,015 | B1 | 6/2003 | Fitzgerald et al. .......... | 438/287 |
| 6,646,322 | B1 | 11/2003 | Fitzgerald ................. | 257/531 |
| 6,649,480 | B1 | 11/2003 | Fitzgerald et al. .......... | 438/285 |
| 6,649,492 | B1 | 11/2003 | Chu et al. .................. | 438/478 |
| 6,876,010 | B1 * | 4/2005 | Fitzgerald ................. | 257/191 |

* cited by examiner

*Primary Examiner*—Carl Whitehead, Jr.
*Assistant Examiner*—Monica D. Harrison

(57) ABSTRACT

A method of forming a relaxed silicon-germanium layer for use as an underlying layer for a subsequent, overlying tensile strain silicon layer, has been developed. The method features initial growth of a underlying first silicon-germanium layer on a semiconductor substrate, compositionally graded to feature the largest germanium content at the interface of the first silicon-germanium layer and the semiconductor substrate, with the level of germanium decreasing as the growth of the graded first silicon-germanium layer progresses. This growth sequence allows the largest lattice mismatch and greatest level of threading dislocations to be present at the bottom of the graded silicon-germanium layer, with the magnitude of lattice mismatch and threading dislocations decreasing as the growth of the graded silicon-germanium layer progresses. In situ growth of an overlying silicon-germanium layer featuring uniform or non-graded germanium content, results in a relaxed silicon-germanium layer with a minimum of dislocations propagating from the underlying graded silicon-germanium layer. In situ growth of a silicon layer results in a tensile strain, low defect density layer to be used for MOSFET device applications.

25 Claims, 2 Drawing Sheets

METHOD OF FORMING A RELAXED SEMICONDUCTOR BUFFER LAYER ON A SUBSTRATE WITH A LARGE LATTICE MISMATCH

This application is a Continuation-In-Part of U.S. application, Ser. No. 10/763,305, file date Jan. 23, 2004, assigned to a common assignee, and which is herein incorporated by reference in its entirety.

BACKGROUND OF THE INVENTION (1) Field of the Invention

The present invention relates to methods used to fabricate semiconductor devices and more specifically to a method used to form a relaxed semiconductor buffer layer prepared for subsequent accommodation of an overlying semiconductor layer featuring a tensile strain.

(2) Description of Prior Art

The ability to form devices such as a metal oxide semiconductor field effect transistor (MOSFET) in a semiconductor layer comprised with tensile strain has allowed the performance of the MOSFET to be increased via enhanced mobility of carriers in the strained semiconductor layer channel region. This can be achieved for several applications such as a strained silicon layer on an underlying relaxed silicon-germanium layer, or an underlying relaxed InGaAs layer on a GaAs substrate, accommodating an overlying strained layer. Methods of forming tensile strained layers such as a silicon layer as an example, include forming the silicon layer on an underlying relaxed layer such as a silicon-germanium layer. The relaxed silicon-germanium layer located on an underlying silicon substrate has been called a silicon-germanium virtual substrate. The growth of a relaxed semiconductor layer such as silicon-germanium can be challenging since it encompasses controlled nucleation, propagation, and interaction of misfit dislocations that terminate with threading arms that extend to the surface and then can be replicated in subsequently grown layers such as the overlying strained silicon layer which will be employed for accommodation of a subsequent device. The defects in the strained silicon layer propagated from the misfit dislocations in the underlying relaxed silicon-germanium layer, can deleterious influence MOSFET leakage and yield.

The crystalline quality of the relaxed silicon-germanium layer can be improved by growing a compositionally graded, thick silicon-germanium layer at a thickness greater than a micrometer. The compositionally graded relaxed layer can be achieved via increasing the germanium content from the bottom to the top surface of the compositionally graded silicon-germanium layer, with this sequence resulting in increased lattice mismatch at the top surface of the graded semiconductor alloy layer. Another approach which will be featured in the present invention is creation of a compositionally graded silicon-germanium layer, however featuring decreasing germanium content from the bottom to the top surface of the compositionally graded semiconductor alloy layer. This approach uses the highest lattice mismatch, as well as the maximum dislocation formation, near the underlying semiconductor surface resulting in yield and process benefits when compared to counterpart compositionally graded semiconductor alloy layers. Prior art such as Chu et al in U.S. Pat. No. 6,649,492 B1, Fitzgerald in U.S. Pat. No. 6,649,322 B2, and Cheng et al in U.S. Pat. No. 6,515,335, have described methods of varying germanium content in a silicon-germanium layer as well as forming a graded silicon-germanium layer to spread lattice mismatch minimizing dislocation propagation. The above prior art however do not describe the unique sequence described in the present invention for formation of a semiconductor alloy layer featuring a relaxed, low defect layer needed for accommodation of an overlying strained semiconductor layer, that is a process sequence allowing the largest lattice mismatch to occur at the semiconductor substrate-semiconductor alloy interface.

SUMMARY OF THE INVENTION

It is an object of this invention to form a strained semiconductor layer using silicon as an example, on an underlying relaxed layer such as silicon-germanium layer.

It is another object of this invention to form a relaxed, non-graded silicon-germanium layer on a compositionally graded silicon-germanium layer which in turn is formed on a semiconductor substrate, with the highest lattice mismatch occurring at the interface of the compositionally graded silicon-germanium layer and semiconductor substrate.

It is still another object of this invention to form a compositionally graded silicon germanium layer comprised with a highest germanium content in the bottom, and with a lowest germanium content in the top portion of the compositionally graded layer, resulting in the desired location for the greatest lattice mismatch, and wherein an overlying non-graded, relaxed silicon-germanium layer can be grown featuring a low defect density.

In accordance with the present invention a compositionally graded silicon-germanium layer is formed on a semiconductor substrate allowing growth of an overlying low defect density, relaxed, non-graded silicon-germanium buffer layer to be accomplished. Epitaxial growth procedures are employed to grow a silicon-germanium layer on an underlying semiconductor substrate in which a first portion of the silicon-germanium layer is a compositionally graded silicon-germanium layer, wherein the germanium content in the silicon-germanium layer is continuously decreased as the growth procedure progresses. After growth of the graded silicon-germanium portion a non-graded portion of a silicon-germanium layer is grown on the underlying compositionally graded silicon-germanium portion. The configuration of an non-graded silicon-germanium component on an underlying compositionally graded silicon-germanium component, results in a relaxed, non-graded silicon-germanium component featuring a low defect density as a result of the highest lattice mismatch located at the compositionally graded silicon-germanium-semiconductor substrate interface. For MOSFET applications a silicon layer is grown on the relaxed, non graded silicon-germanium component, with the silicon layer featuring the desired tensile strain.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
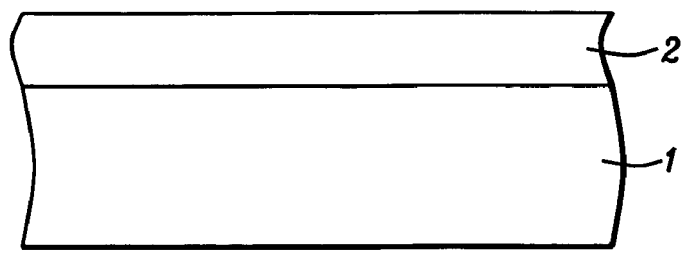
FIGS. 1–3, and 5, which schematically in cross-sectional style describe the key stages in the formation of a relaxed silicon-germanium layer on a compositionally graded silicon-germanium layer wherein the graded silicon-germanium layer features decreasing germanium content extending from the bottom to the top of the graded silicon-germanium layer.

The method of forming a low defect density, relaxed alloy layer on an underlying compositionally graded underlying alloy layer featuring decreasing content of a component of the alloy layer, extending from the bottom to the top of the underlying compositionally graded alloy component, will now be described in detail. To facilitate this description silicon-germanium will be used as the example of the alloy layer, however it should be understood that other examples such as a relaxed InGaAs alloy layer accommodating an overlying strained InP layer, can also be obtained via the identical process sequence described for the relaxed silicon-germanium example. Semiconductor substrate 1, either N or P type, comprised of single crystalline silicon is used and schematically shown in FIG. 1. For the InGaAs relaxed layer a GaAs substrate would be required. The essence of this invention is the formation of a relaxed semiconductor alloy layer such as silicon-germanium, via a lattice mismatch with an underlying semiconductor material, with the relaxed silicon-germanium layer featuring a low level of threading dislocations so that an overlying semiconductor layer such as silicon can be grown on the underlying relaxed layer with a minimum of dislocations propagating from the underlying relaxed silicon-germanium layer into the overlying tensile strain silicon layer. To achieve the above objective a compositionally graded silicon-germanium portion will first be grown with the largest germanium content introduced into a first or bottom portion of the layer, and with successive portions grown with decreasing germanium content. This will be followed by growth of an overlying, non-graded silicon-germanium portion, comprised with relaxed strain. Therefore the initial portion of the compositionally graded silicon-germanium layer initiates with the growth of silicon-germanium portion 2. Silicon-germanium portion 2, is formed via molecular beam epitaxy (MBE), or via low pressure chemical vapor deposition (LPCVD) procedures, to a thickness between about 300 to 1000 Angstroms, using a growth temperature between about 500 to 600° C. Silane or disilane is used as the reactant for the silicon component of silicon-germanium portion 2, while germane is used to provide the germanium component. Silicon-germanium portion 2, denoted as $Si_{(1-x1)}Ge_{x1}$ is comprised with a germanium atomic percent denoted as x1, between about 50 to 0%. Germanium content x1, will be the greatest level of germanium formed when compared to successively grown overlying silicon-germanium portions, and thus the largest lattice mismatch will occur at the interface of silicon-germanium portion 2-semiconductor substrate 1. The large mismatch at this interface will ultimately allow an overlying silicon-germanium layer to be grown in a relaxed form, while burying the unwanted threading dislocations in the underlying silicon-germanium portion 2. The result of the growth of silicon-germanium portion 2, is schematically shown in FIG. 1. The growth parameters such as pressure, sources, etc, are chosen so that the layers deposited are epitaxial and smooth.

Growth of additional portions of the compositionally graded silicon-germanium layer is continued with each successive portion grown with less germanium content than the previously grown underlying portion. Silicon-germanium portion 3, denoted by $Si_{(1-x2)}Ge_{x2}$ is comprised with a germanium atomic percent x2, between about 50 to 0%, wherein germanium atomic percent x2 is less than germanium atomic percent x1, in underlying silicon-germanium portion 2. Silicon-germanium portion 4, denoted by $Si_{(1-xn)}Ge_{xn}$ is comprised with a germanium atomic percent xn, between about 50 to 0%, wherein germanium atomic percent xn is greater than zero but less than the germanium content in the directly underlying silicon-germanium portion 3. The compositionally graded silicon-germanium layer shown schematically in FIG. 2, will be comprised with the largest lattice mismatch at the interface of silicon-germanium portion 2-semiconductor substrate 1, with the density of threading dislocations less in silicon-germanium portion 4, when compared to threading dislocations in underlying silicon-germanium portions, portions featuring greater germanium contents with larger lattice mismatch.

Figure 2:
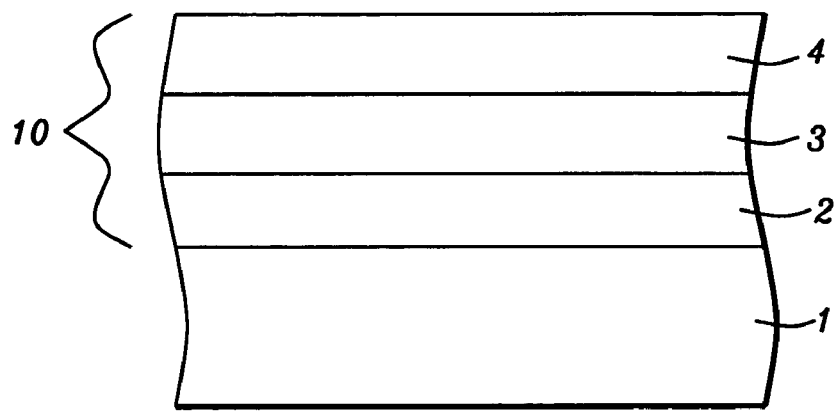

Silicon-germanium portions 3 and 4, are again grown via MBE or LPCVD procedures, again at growth parameters allowing a smooth, epitaxial layer to be obtained, such as a temperature between about 500 to 600° C., using silane or disilane and germane as reactants. Each portion is again grown to a thickness between about 50 to 200 Angstroms. Compositionally graded silicon-germanium layer 10, now comprised of thin portions of silicon-germanium in which the germanium content decreases from silicon-germanium portion 2, to silicon-germanium portion 4, is schematically shown in FIG. 2. The thickness of compositionally graded silicon-germanium layer 10, is between about 200 to 1000 Angstroms. It should be understood that although only three thin silicon-germanium portions are shown in this description the grading of silicon-germanium layer 10, can be comprised with numerous thin portions, with each overlying thin portion comprised with less germanium than the underlying portion. Graded silicon-germanium layer 10, can be formed during a single growth procedure featuring varying growth parameters such as reactant flow, during the growth procedure.

Figure 3:
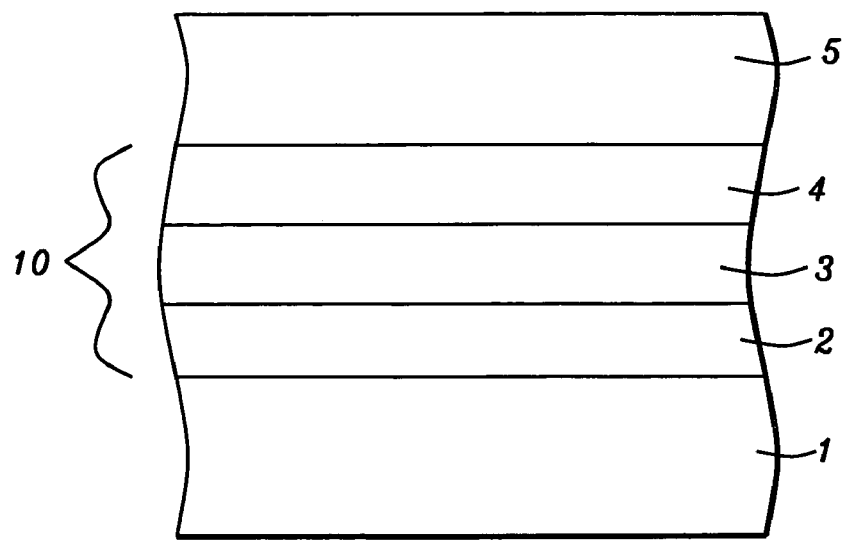
Figure 4:
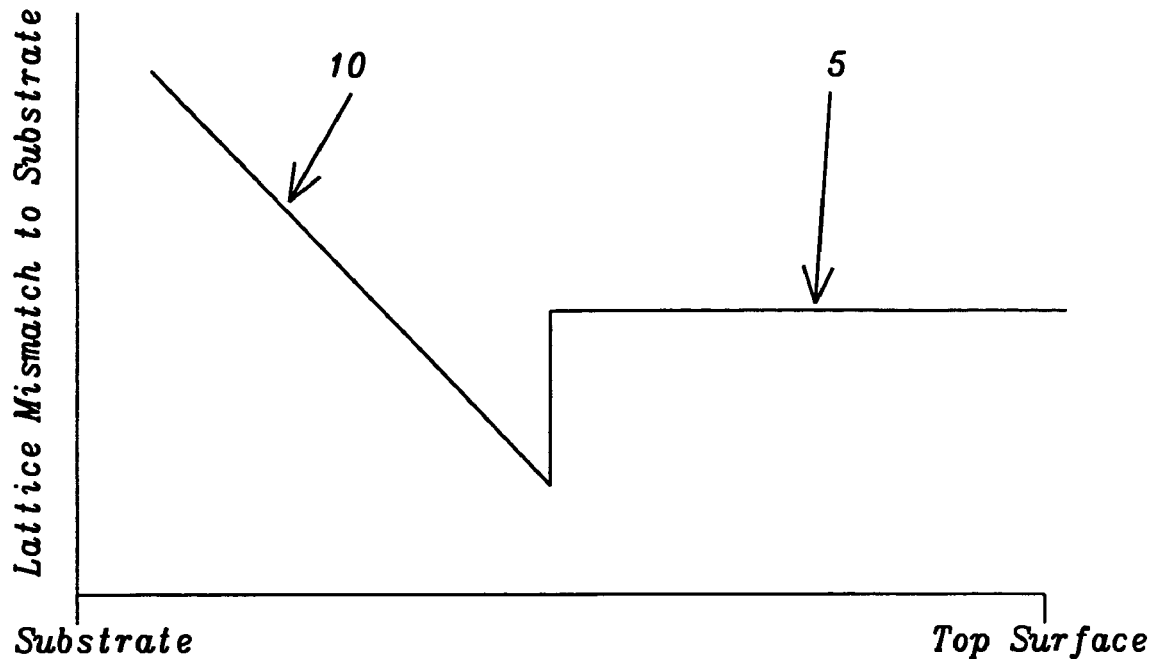
FIG. 4, which graphically represents the relationship of lattice mismatch as a function of configuration location, with the configuration ranging from the top surface of the semiconductor substrate to top surface of the non-graded semiconductor alloy layer.

Silicon-germanium layer 5, shown schematically in FIG. 3, is next uniformly grown without germanium grading, to a thickness between about 2,000 to 10,000 Angstroms. Silicon-germanium layer 5, homogeneously comprised with equal amounts of germanium, between about 20 to 100 atomic percent is obtained via MBE or LPCVD procedures, at a temperature between about 500 to 600° C., using silane or disilane as a silicon source, while germane is employed for germanium. Silicon-germanium layer 5, grown in situ in the same apparatus used for growth of compositionally graded silicon-germanium layer 10, is obtained in a strain relaxed form. If desired an optional anneal procedure can be applied, in-situ, to optimize strain relaxation. The propensity of threading dislocations in underlying portions of graded silicon-germanium layer 10, resulting from lattice mismatch, do not reach overlying silicon-germanium layer 5. FIG. 4, graphically represents the magnitude of mismatch, correlatable to threading dislocations, as a function of position in both compositionally graded silicon-germanium layer 10, and in non-graded silicon-germanium layer 5. It can be seen that the largest lattice mismatch occurs at the interface of compositionally graded silicon-germanium layer 10, and semiconductor substrate 1, with a reduced lattice mismatch resulting from growth of non-graded silicon-germanium layer.

Figure 5:
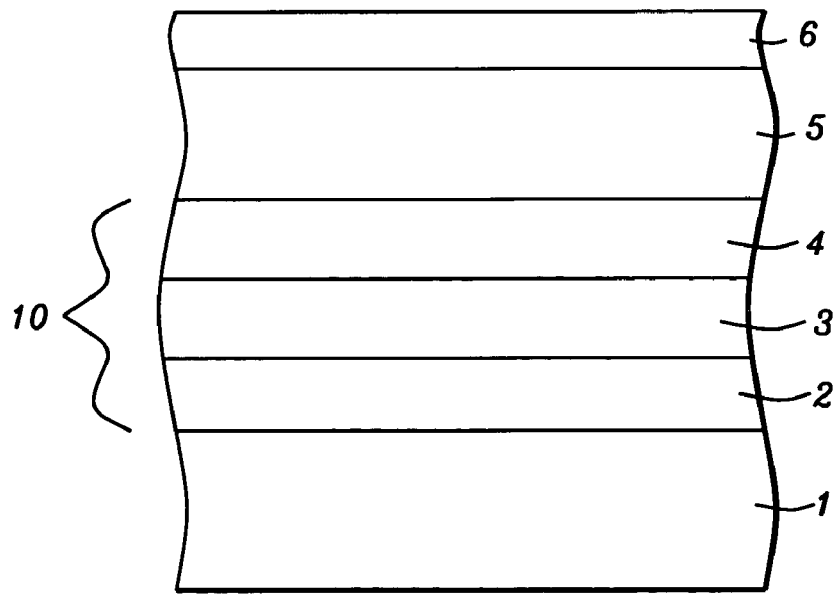

If a device structure such as a MOSFET is desired silicon layer 6, shown schematically in FIG. 5, can be grown on relaxed, non-graded silicon-germanium layer 5, via MBE or LPCVD procedures, accomplished in situ in the same apparatus used for growth of the silicon-germanium layers. Silicon layer 6, comprised with tensile strain, is grown to a thickness between about 100 to 200 Angstroms, at a temperature between about 500 to 600° C., using silane or disilane as a silicon source. The strain relaxed form of underlying silicon-germanium layer 5, allowed silicon layer 6, to be obtained with the desired tensile strain. The use of underlying compositionally graded silicon-germanium layer 10, featuring the largest lattice mismatch at the semiconductor substrate interface allowed threading dislocations to decrease as the thickness of the layer increased, thus resulting in little dislocation propagation into silicon layer 6. Thus silicon layer 6, can now be used to accommodate a channel region of a MOSFET device which will feature enhanced carrier mobility as a result of the tensile strained layer, and will also feature a low defect density and the prospect of a low leakage device as a result of non-propagating dislocations from underlying layers.

While this invention has been particularly shown and described with reference to, the preferred embodiments thereof, it will be understood by those skilled in the art that various changes in form and details may be made without departing from the spirit and scope of this invention. For example a relaxed, non-graded InGaAs layer can be formed on an underlying compositionally graded InGaAs layer, which in turn is formed on a GaAs substrate, with the highest lattice mismatch occurring at the interface of the compositionally grade layer and the substrate.

What is claimed is:

1. A method of forming a semiconductor alloy layer, comprising the steps of:
    providing a semiconductor substrate;
    growing a graded, first semiconductor alloy layer wherein the content of a component of said graded, first semiconductor alloy layer is decreased as the growth of said graded, first semiconductor alloy layer progresses;
    growing a second semiconductor alloy layer on said graded, first semiconductor alloy layer, wherein the content of said component in said second semiconductor alloy layer is uniform, and wherein said second semiconductor alloy layer is in a strain relaxed form; and
    forming a semiconductor layer on said relaxed second semiconductor alloy layer, wherein said semiconductor layer is comprised with tensile strain.

2. The method of claim 1, wherein said semiconductor substrate is a silicon semiconductor substrate, or a GaAs substrate.

3. The method of claim 1, wherein said graded, first semiconductor alloy layer is a silicon-germanium layer or an InGaAs layer.

4. The method of claim 1, wherein said graded, first semiconductor alloy layer is obtained via molecular beam epitaxy (MBE) or via low pressure chemical vapor deposition (LPCVD) procedures.

5. The method of claim 1, wherein said component in said graded, first semiconductor alloy layer, for a silicon-germanium alloy layer, is germanium.

6. The method of claim 1, wherein said graded, first semiconductor alloy layer is grown to a thickness between about 300 to 1000 Angstroms.

7. The method of claim 1, wherein said graded, first semiconductor alloy layer is comprised with a group of semiconductor alloy layer portions denoted as $Si_{(1-x)}Ge_x$, wherein x is the content in atomic percent of said component, and wherein x1 is the content in atomic percent of said component in the portion of said graded, first semiconductor alloy layer located at the semiconductor substrate surface and with decreasing atomic percent of said component denoted by x2, x3, and xn, wherein xn is the content in atomic percent of said component at the top surface of said graded, first semiconductor alloy layer.

8. The method of claim 1, wherein the content in atomic percent of said component in said graded, first semiconductor alloy layer, ranges between about 50 to 0%.

9. The method of claim 1, wherein said second semiconductor alloy layer is a silicon-germanium layer or a InGaAs layer.

10. The method of claim 1, wherein said second semiconductor alloy layer is obtained via molecular beam epitaxy (MBE) or via low pressure chemical vapor deposition (LPCVD) procedures.

11. The method of claim 1, wherein said second semiconductor alloy layer is grown to a thickness between about 2,000 to 10,000 Angstroms.

12. The method of claim 1, wherein said second semiconductor alloy layer is comprised with an atomic percent of said component, between about 20 to 100%.

13. The method of claim 1, wherein said semiconductor layer is a silicon layer for the silicon-germanium example, or a InP layer for the InGaAs example.

14. The method of claim 1, wherein said semiconductor layer is obtained via MBE or via LPCVD procedures at a thickness between about 100 to 200 Angstroms.

15. A method of forming a strain relaxed silicon-germanium layer, comprising the steps of
    providing a semiconductor substrate;
    growing a graded silicon-germanium layer wherein the content of a germanium component in said graded silicon germanium layer is decreased as the growth of said graded, first silicon-germanium layer progresses;
    growing a relaxed silicon-germanium layer on said graded silicon-germanium layer, in situ in same apparatus used for growth of said graded silicon-germanium layer, and wherein the content of germanium component in said relaxed silicon-germanium layer is uniform; and
    forming a silicon layer on said relaxed silicon-germanium layer, in situ in said apparatus, and wherein said silicon layer is comprised with tensile strain.

16. The method of claim 15, wherein said semiconductor substrate is a silicon semiconductor substrate.

17. The method of claim 15, wherein said graded silicon-germanium layer is obtained via molecular beam epitaxy (MBE) or via low pressure chemical vapor deposition (LPCVD) procedures, to a thickness between about 300 to 1000 Angstroms.

18. The method of claim 15, wherein said graded silicon-germanium layer is grown using silane or disilane as a silicon source, and using germane as a germanium source.

19. The method of claim 15, wherein said graded silicon-germanium is comprised with a group of silicon-germanium portions denoted as $Si_{(1-x)}Ge_x$, wherein x is the atomic percent of germanium, and wherein x1 is the atomic percent of germanium in the portion of said graded silicon-germanium layer located at the semiconductor substrate surface and with decreasing atomic percentages of germanium denoted by x2, x3, and xn, wherein xn is the atomic percent of germanium at the top surface of said graded silicon-germanium layer.

20. The method of claim 15, wherein the atomic percent of germanium in said graded silicon-germanium layer ranges between about 50 to 0%.

21. The method of claim 15, wherein said relaxed silicon-germanium layer is obtained via molecular beam epitaxy (MBE) or via low pressure chemical vapor deposition (LPCVD) procedures at a thickness between about 2,000 to 10,000 Angstroms.

22. The method of claim 15, wherein said relaxed silicon-germanium layer is grown using silane or disilane as a silicon source, and using germane as a germanium source.

23. The method of claim 15, wherein said relaxed silicon-germanium layer is comprised with a germanium atomic percent between about 20 to 100%.

24. The method of claim 15, wherein said silicon layer is obtained via MBE or via LPCVD procedures at a thickness between about 100 to 200 Angstroms.

25. The method of claim 15, wherein said silicon layer is grown using silane or disilane as a source.

* * * * *